(12) United States Patent
Cheng et al.

(10) Patent No.: US 10,886,391 B2
(45) Date of Patent: *Jan. 5, 2021

(54) SINGLE-ELECTRON TRANSISTOR WITH WRAP-AROUND GATE

(71) Applicant: INTERNATIONAL BUSINESS MACHINES CORPORATION, Armonk, NY (US)

(72) Inventors: Kangguo Cheng, Schenectady, NY (US); Xin Miao, Guilderland, NY (US); Wenyu Xu, Albany, NY (US); Chen Zhang, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 39 days.

This patent is subject to a terminal disclaimer.

(21) Appl. No.: 16/431,862

(22) Filed: Jun. 5, 2019

(65) Prior Publication Data

US 2019/0288097 A1 Sep. 19, 2019

Related U.S. Application Data

(63) Continuation of application No. 15/623,877, filed on Jun. 15, 2017, now Pat. No. 10,374,073, which is a (Continued)

(51) Int. Cl.
*H01L 29/76* (2006.01)
*H01L 29/66* (2006.01)
(Continued)

(52) U.S. Cl.
CPC ...... *H01L 29/7613* (2013.01); *H01L 29/0665* (2013.01); *H01L 29/1033* (2013.01);
(Continued)

(58) Field of Classification Search
CPC ......... H01L 29/66439; H01L 29/66977; H01L 29/66795; H01L 29/0665; H01L 29/0664;
(Continued)

(56) References Cited

U.S. PATENT DOCUMENTS 6,335,245 B2 1/2002 Park et al.
6,894,352 B2 5/2005 Hu et al.
(Continued)

FOREIGN PATENT DOCUMENTS

CN 101359684 A 2/2009
JP 6-302806 A 10/1994
(Continued)

OTHER PUBLICATIONS

Anonymous, "Vertical Single Electron Transistor" IP.com (Dec. 14, 2015) pp. 1-5, IP.com No. IPCOM000244464D.
List of IBM Patents or Patent Applications Treated as Related dated Jun. 5, 2019, 2 pages.

*Primary Examiner* — Joseph M Galvin, III
(74) *Attorney, Agent, or Firm* — Tutunjian & Bitetto, P.C.; Daniel Morris

(57) ABSTRACT

Transistors and methods of forming the same include forming a fin that has an active layer between two sacrificial layers. Material is etched away from the two sacrificial layers in a region of the fin. A gate stack is formed around the active layer in the region. The active layer is etched after forming the gate stack to form a quantum dot.

16 Claims, 8 Drawing Sheets

Related U.S. Application Data continuation of application No. 15/140,557, filed on Apr. 28, 2016, now Pat. No. 9,859,409.

(51) Int. Cl.
*H01L 29/423* (2006.01)
*H01L 29/12* (2006.01)
*H01L 29/06* (2006.01)
*H01L 29/10* (2006.01)

(52) U.S. Cl.
CPC ...... *H01L 29/127* (2013.01); *H01L 29/42356* (2013.01); *H01L 29/66439* (2013.01); *H01L 29/66545* (2013.01)

(58) Field of Classification Search
CPC ............... H01L 29/1033; H01L 29/127; H01L 29/42356; H01L 29/66545; H01L 29/7613
See application file for complete search history.

(56) References Cited

U.S. PATENT DOCUMENTS

| | | | |
|---|---|---|---|
| 7,547,932 B2 | 6/2009 | Zhang et al. | |
| 8,124,961 B2 | 2/2012 | Suk et al. | |
| 8,158,538 B2 | 4/2012 | Choi et al. | |
| 10,381,468 B2* | 8/2019 | Cheng | H01L 29/7613 |
| 2015/0279958 A1* | 10/2015 | Greene | H01L 29/6681 257/192 |
| 2016/0079394 A1* | 3/2016 | Li | H01L 29/78696 257/347 |
| 2017/0222006 A1* | 8/2017 | Suh | H01L 29/0847 |
| 2017/0256611 A1* | 9/2017 | Kim | H01L 29/775 |

FOREIGN PATENT DOCUMENTS

| | | |
|---|---|---|
| KR | 10-2010-0080023 A | 7/2010 |
| KR | 10-2013-0019201 A | 2/2013 |

\* cited by examiner

SINGLE-ELECTRON TRANSISTOR WITH WRAP-AROUND GATE

BACKGROUND

Technical Field

The present invention relates to semiconductor devices and, more particularly, to single-electron transistors.

Description of the Related Art

As conventional fabrication methods improve, and logic devices such as transistors become smaller, devices approach a limit of what can be achieved using standard complementary metal-oxide semiconductor (CMOS) processes. Single-electron transistors (SETs), which operate by quantum tunneling effects, can provide logic devices at even smaller scales than CMOS.

SUMMARY

A method for forming a transistor includes forming a fin that has an active layer between two sacrificial layers. Material is etched away from the two sacrificial layers in a region of the fin. A gate stack is formed around the active layer in the region. The active layer is etched after forming the gate stack to form a quantum dot.

A method for forming a transistor includes forming a fin that has an active layer between two sacrificial layers. Material from the two sacrificial layers is etched away in a region of the fin. A gate stack is formed around the active layer in the region. A dielectric layer is formed over and around the fin and the gate stack. Source and drain regions are formed in contact with the active layer.

A method for forming a transistor includes forming a fin that has an active layer between two sacrificial layers. Material is etched away from the two sacrificial layers in a region of the fin. A gate stack is formed around the active layer in the region, including forming a gate dielectric layer on surfaces in the region. Source and drain regions are formed in contact with the active layer.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Embodiments of the present invention provide single-electron transistors (SETs) that operate at high temperature and have a wrap-around gate, with a process flow that is fully compatible with planar fabrication processes. The present embodiments employ a quantum dot that is surrounded by gate material in one cross-section and has a very small diameter.

Figure 1:
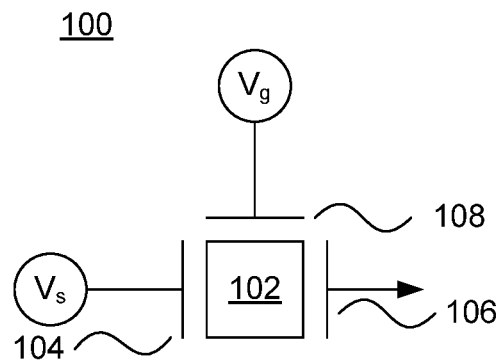
FIG. 1 is a circuit diagram of a single-electron transistor in accordance with the present principles.

Referring now to FIG. 1, a schematic of an SET 100 is shown. The SET 100 includes a quantum dot 102 (also known as an "island") between a source terminal 104 and drain terminal 106. A gate 108 is capacitively coupled to the quantum dot 102. The SET 100 has a blocking state and a conducting state, depending on a gate voltage applied to the gate 108.

The SET 100 operates by quantum tunneling. A drain voltage is applied to the drain terminal 106 (while the source terminal 104 is grounded). In the blocking state, electrons at the source terminal 104 cannot tunnel onto the quantum dot 102, as there are no appropriate energy levels for it there. Applying the gate voltage to the gate 108, however, causes the energy levels of the quantum dot 102 to change, putting at least one energy level within reach of the electron. The electron tunnels to the quantum dot 102 and subsequently tunnels to the drain terminal 106 to form a current, such that the SET 100 is in a conducting state when the gate voltage is applied.

The operation of the SET 100 is characterized by the capacitances of the different components. In particular, a total capacitance ($C_{total}$) is the sum of the gate capacitance (between the quantum dot 102 and the gate 108), the drain capacitance (between the quantum dot 102 and the drain terminal 106), and the source capacitance (between the quantum dot 102 and the source terminal 104). It should be noted that the quantum dot 102 is selected to have low self-capacitance. To operate an SET 100 at high temperature, the size (namely, $C_{total}$) of the quantum dot 102 should be very small, such that the charging energy of an electron ($q^2/2C_{total}$) is larger than 20 KT, where q is the charge of an electron, K is the Boltzmann constant, and T is the temperature.

Figure 2:
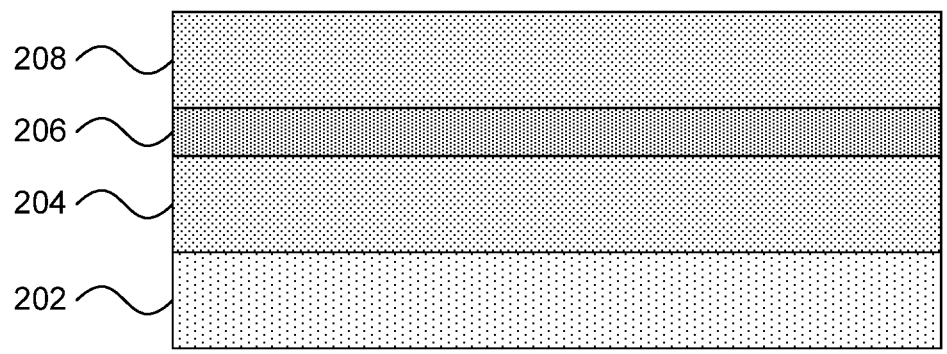
FIG. 2 is a cross-sectional diagram of a step in forming a single-electron transistor in accordance with the present principles.

Referring now to FIG. 2, a step in fabricating an SET is shown. A semiconductor substrate 202 is formed from an appropriate semiconductor material. It should also be understood that the substrate may instead be formed as a semiconductor-on-insulator substrate, instead of a bulk semiconductor. The semiconductor substrate 202 may be formed from a silicon-containing material. Illustrative examples of silicon-containing materials suitable for the semiconductor substrate 202 may include, but are not limited to, silicon, silicon germanium, silicon germanium carbide, silicon carbide, polysilicon, epitaxial silicon, amorphous silicon, and multilayers thereof. Although silicon is predominately used in wafer fabrication, alternative semiconductor materials can be employed, such as, but not limited to, germanium, gallium nitride, cadmium telluride, and zinc sellenide.

Further alternatives for the semiconductor layer 202 include III-V compound semiconductors. The term "III-V compound semiconductor" denotes a semiconductor material that includes at least one element from Group III of the Periodic Table of Elements (International Union of Pure and Applied Chemistry Group 13) and at least one element from Group V of the Periodic Table of Elements (International Union of Pure and Applied Chemistry Group 15). Typically, the III-V compound semiconductors are binary, ternary or quaternary alloys including III/V elements. Examples of III-V compound semiconductors that can be used in the present embodiments include, but are not limited to alloys of gallium arsenic, aluminum arsenic, indium gallium arsenic, indium aluminum arsenic, indium aluminum arsenic antimony, indium aluminum arsenic phosphorus, indium gallium arsenic phosphorus and combinations thereof.

A first layer of sacrificial material 204 is formed on the substrate 202. It is specifically contemplated that the first layer of sacrificial material 204 may be formed from silicon germanium, though it should be understood that any appropriate material may be used instead. An active layer 206 is formed on the first layer of sacrificial material 204. It is specifically contemplated that the active layer 206 may be formed from doped silicon. A second layer of sacrificial material 208 is formed on the active layer 206. It is specifically contemplated that the second layer of sacrificial material 208 may be formed from the same material as the first layer of sacrificial material 204 (e.g., silicon germanium), but any appropriate material may be used instead.

It is specifically contemplated that the active layer 206 may be doped. In one particular embodiment, an n-type dopant may be used. As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous. The dopant may be formed in situ with the active layer 206 or may, alternatively, be implanted by bombardment. The dopant may have an exemplary concentration between zero and about $5\times10^{21}$ atoms/cm$^3$.

Figure 3:
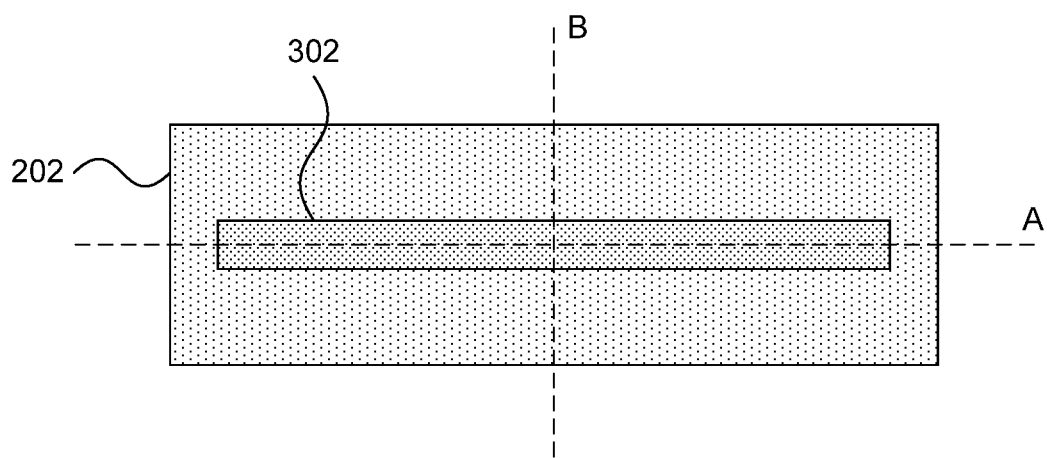
FIG. 3 is a top down diagram of a step in forming a single-electron transistor in accordance with the present principles.

Referring now to FIG. 3, a top-down view of a step in fabricating an SET is shown. One or more fins 302 are formed by etching the stack of sacrificial layers 204/208 and the active layer 206. The fins 302 may be formed by any appropriate process including, e.g., photolithography, whereby regions of the top surface are covered with a photoresist and subsequently exposed to a light that defines the fin pattern. Either exposed or unexposed regions of the resist are removed, depending on the resist chemistry, and the remaining portions (either photoresist or hardmask, for example, silicon nitride) are used as a mask for a subsequent etch. The etch may be any appropriate anisotropic etch such as, e.g., reactive ion etching (RIE). RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point include ion beam etching, plasma etching or laser ablation. Alternatively, the fin structure 302 can be formed by spacer imaging transfer processes.

The figure shows two different cross sections, A and B. Cross section A shows a cut that runs parallel to the length of the fin 302, while cross section B shows a cut that runs perpendicular to the length of the fin 302. Subsequent figures will show one cross section or the other.

Figure 4:
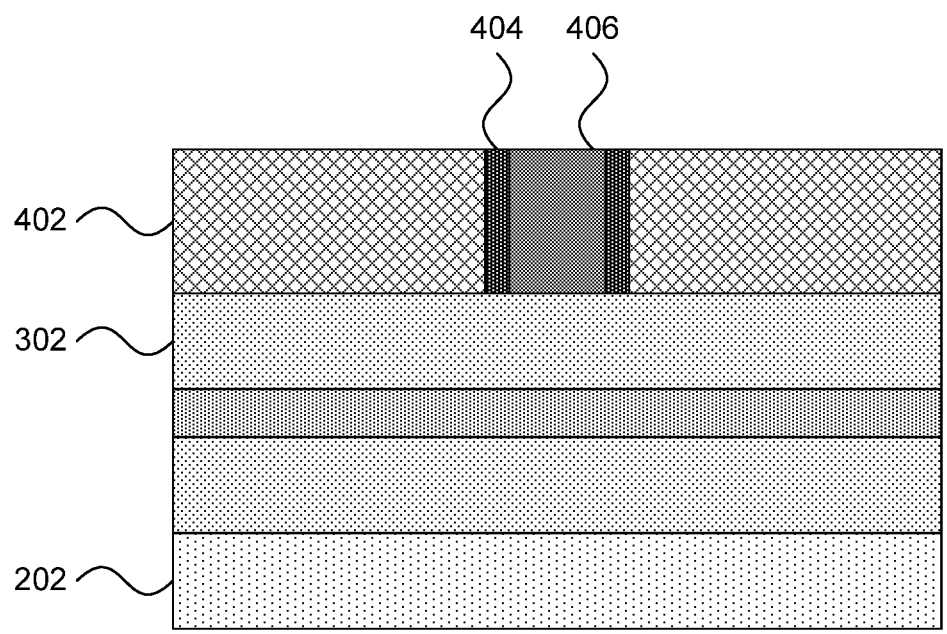
FIG. 4 is a cross-sectional diagram of a step in forming a single-electron transistor along a first cut in accordance with the present principles.

Referring now to FIG. 4, a cross-sectional view of a step in fabricating an SET is shown along cut A. A dummy gate 406 and spacer 404 are formed over the fin 302. Although it is specifically contemplated that the dummy gate 406 may be formed from amorphous silicon or poly-silicon, any appropriate material may be used instead. The spacer 404 is formed on the sidewalls of the dummy gate 406 and may be formed from silicon nitride, but it should be understood that any appropriate hardmask material may be used instead. Exemplary alternative hardmask materials include silicon oxides, silicon oxynitrides, silicon carbides, silicon carbonitrides, and spin-on dielectrics such as silsequioxanes, siloxanes, and boron phosphate silicate glass.

An inter-layer dielectric 402 is deposited over the fin 302 and the dummy gate 406 using, for example, CVD or any other appropriate deposition process. The inter-layer dielectric material is then polished down to the level of the top of the dummy gate 406 using, e.g., chemical mechanical planarization (CMP). CMP is performed using, e.g., a chemical or granular slurry and mechanical force to gradually remove upper layers of the device. The slurry may be formulated to be unable to dissolve, for example, the dummy gate material, resulting in the CMP process's inability to proceed any farther than that layer.

Figure 5:
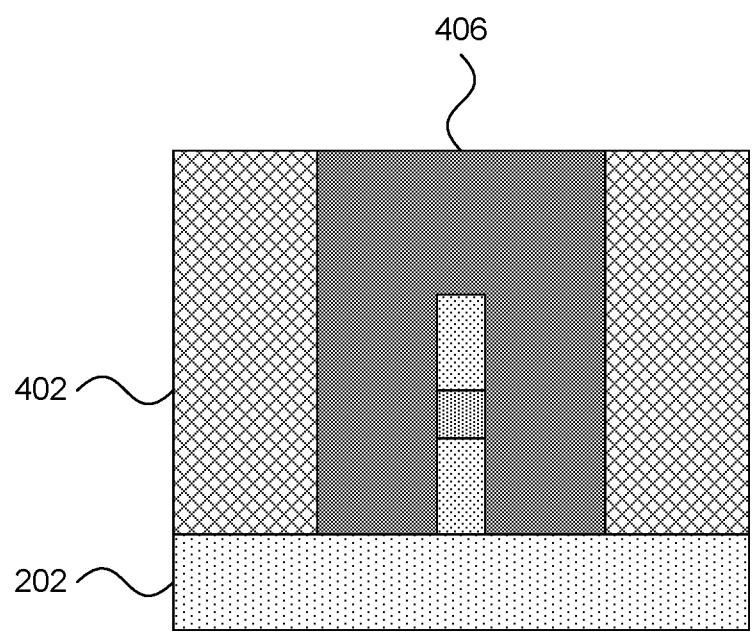
FIG. 5 is a cross-sectional diagram of a step in forming a single-electron transistor along a second cut in accordance with the present principles.

Referring now to FIG. 5, a cross-sectional view of a step in fabricating an SET is shown along cut B. As can be seen, the dummy gate 406 covers the fin 302, which has a narrow profile.

Figure 6:
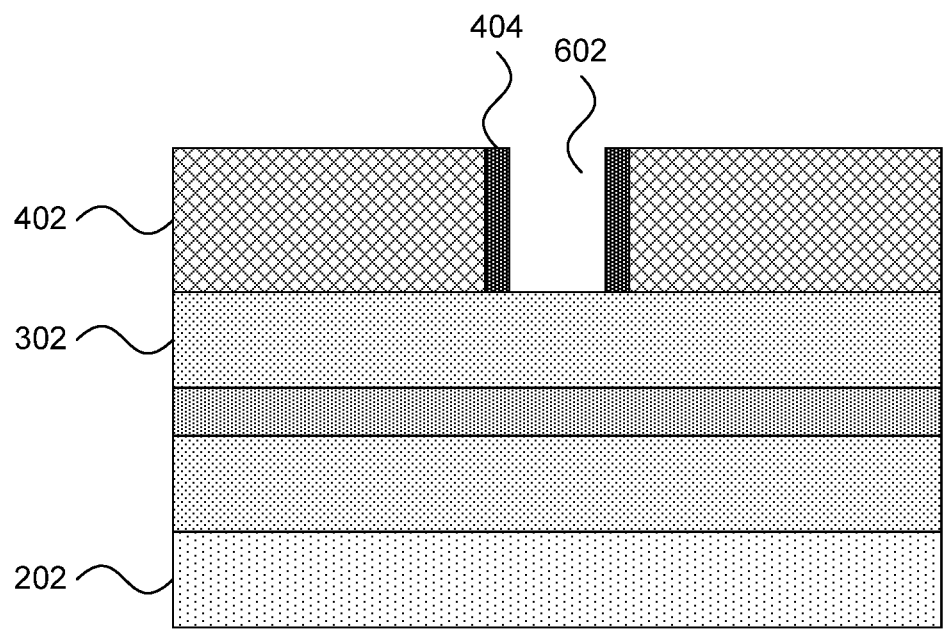
FIG. 6 is a cross-sectional diagram of a step in forming a single-electron transistor along the first cut in accordance with the present principles.

Referring now to FIG. 6, a cross-sectional view of a step in fabricating an SET is shown along cut A. The dummy gate 406 is selectively etched away using, e.g., a wet or dry etch, leaving behind the inter-layer dielectric 402, the spacers 404, and the fin 302. As used herein, the term "etch selectivity" in reference to a material removal process denotes that the rate of material removal for a first material is greater than the rate of removal for at least another material of the structure to which the material removal process is being applied.

Figure 7:
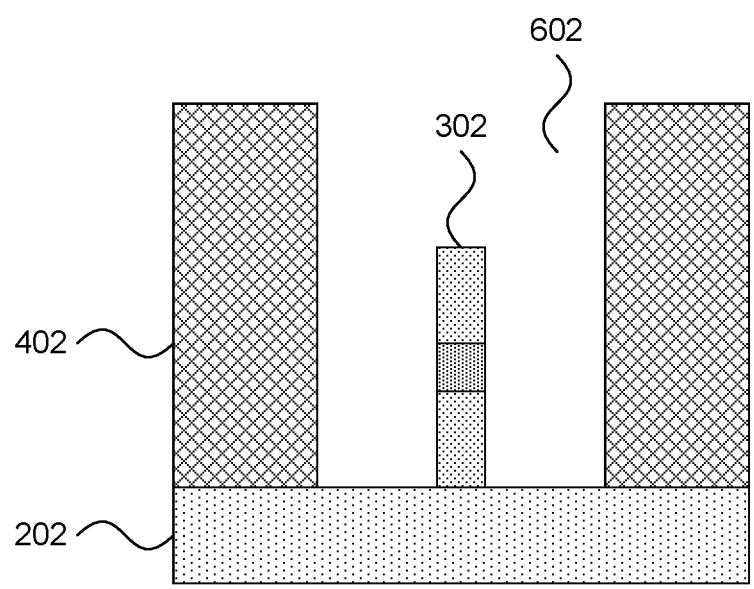
FIG. 7 is a cross-sectional diagram of a step in forming a single-electron transistor along the second cut in accordance with the present principles.

Referring now to FIG. 7, a cross-sectional view of a step in fabricating an SET is shown along cut B. As can be seen, fin 302 is fully exposed within the gap 602.

Figure 8:
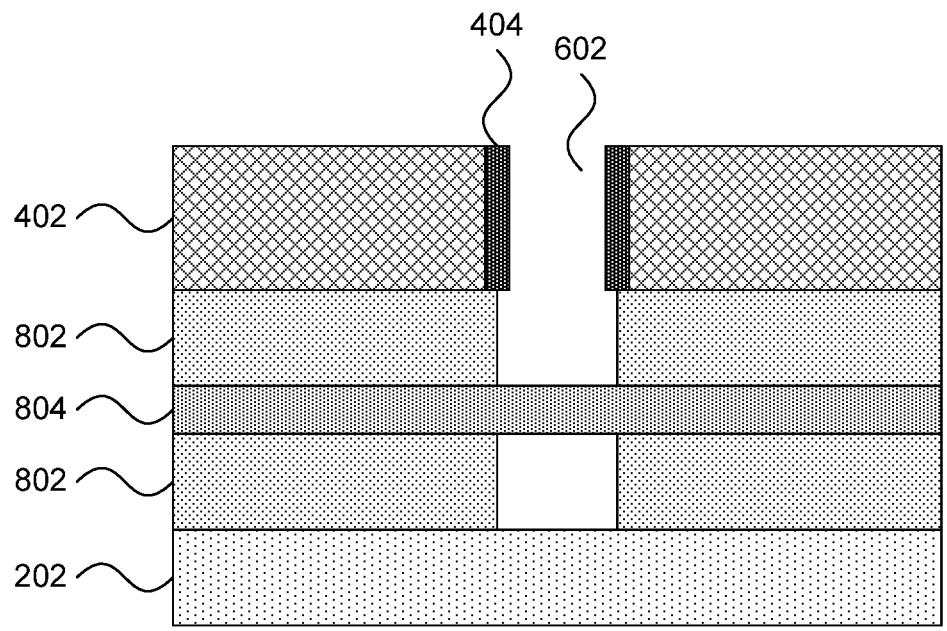
FIG. 8 is a cross-sectional diagram of a step in forming a single-electron transistor along the first cut in accordance with the present principles.

Referring now to FIG. 8, a cross-sectional view of a step in fabricating an SET is shown along cut A. An isotropic etch is used to remove exposed sacrificial material from the fin 302. The isotropic etch has etch selectivity with the remaining active material in the fin 302. As a result, the sacrificial layers 802 are removed around the active layer 804 in the fin 302, with some amount of lateral etching occurring.

Figure 9:
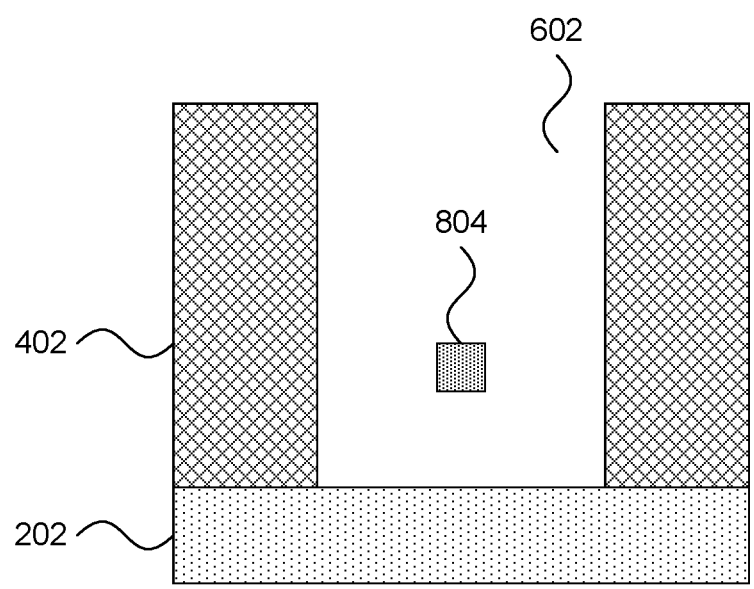
FIG. 9 is a cross-sectional diagram of a step in forming a single-electron transistor along the second cut in accordance with the present principles.

Referring now to FIG. 9, a cross-sectional view of a step in fabricating an SET is shown along cut B. As can be seen, the active layer 804 is suspended in the middle of the gap 602.

Figure 10:
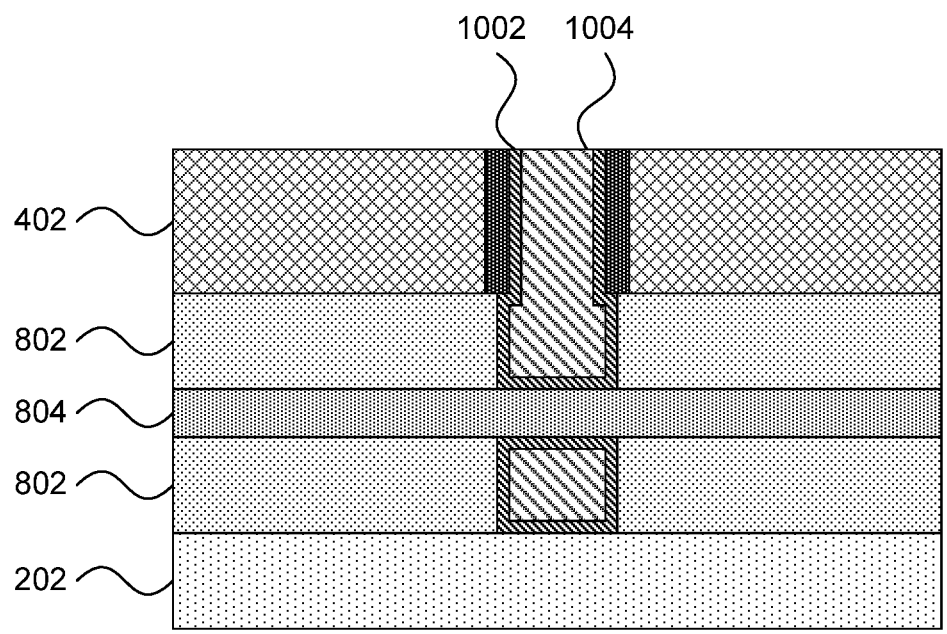
FIG. 10 is a cross-sectional diagram of a step in forming a single-electron transistor along the first cut in accordance with the present principles.

Referring now to FIG. 10, a cross-sectional view of a step in fabricating an SET is shown along cut A. A layer of gate dielectric 1002 is formed on the surfaces of the gap 602. It is specifically contemplated that the gate dielectric 1002 may be a high-k dielectric, but any appropriate insulating material may be used instead. A high-k dielectric is a material having a dielectric constant k that is greater than that of silicon dioxide. Exemplary high-k dielectric materials include hafnium oxides, zirconium oxides, lanthanum oxides, aluminum oxides, titanium oxides, strontium titanium oxides, lanthanum aluminum oxides, yttrium oxides, hafnium oxynitrides, zirconium oxynitrides, lanthanum oxynitrides, aluminum oxynitrides, titanium oxynitrides, strontium titanium oxynitrides, lanthanum aluminum oxynitrides, yttrium oxynitrides, and multilayers thereof.

The remainder of the gap 602 is then filled with a gate 1004. The 1004 may be formed from any appropriate gate material. In one exemplary embodiment, the gate 1004 be formed from metal, but it should be understood that alternative gate materials may include polysilicon germanium, polysilicon/metal silicide, germanium, silicon germanium, silicon germanium carbide, metal silicides, metallic nitrides, metals such as tungsten, iridium, rhenium, ruthenium, titanium, tantalum, hafnium, molybdenum, niobium, nickel, or aluminum, or any other appropriate conductive material.

Figure 11:
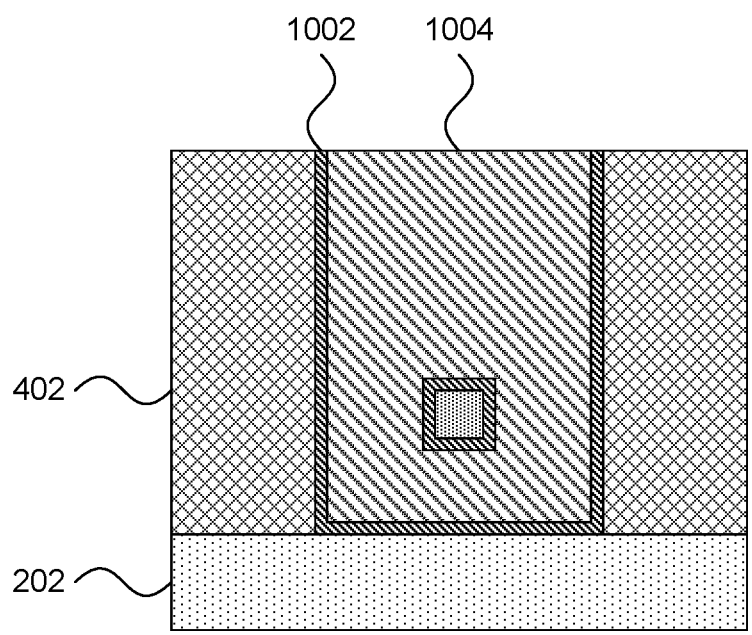
FIG. 11 is a cross-sectional diagram of a step in forming a single-electron transistor along the second cut in accordance with the present principles.

Referring now to FIG. 11, a cross-sectional view of a step in fabricating an SET is shown along cut B. The gate 1004 completely surrounds the suspended active layer 804 in this plane, with a layer of gate dielectric 1002 between the active layer 804 and the gate 1004.

Figure 12:
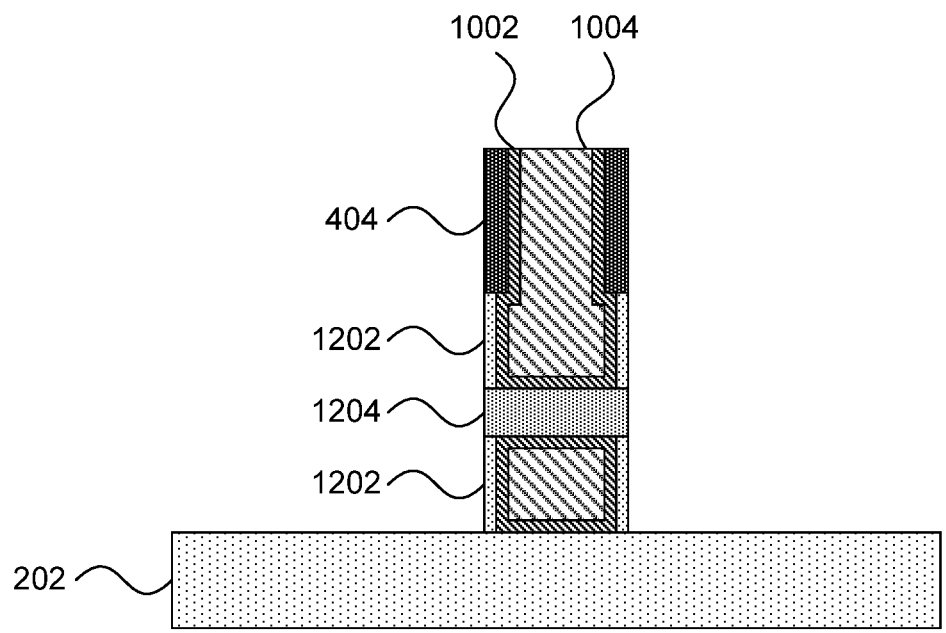
FIG. 12 is a cross-sectional diagram of a step in forming a single-electron transistor along the first cut in accordance with the present principles.

Referring now to FIG. 12, a cross-sectional view of a step in fabricating an SET is shown along cut A. The inter-layer dielectric 402 is removed, along with any portions of the sacrificial layers 802 and active layer 804 that are not covered by the spacers 404, gate dielectric 1002, and gate 1004. The material may be removed using an anisotropic etch such as RIE, leaving remnant sacrificial layers 1202 and the trimmed active layer 1204.

Figure 13:
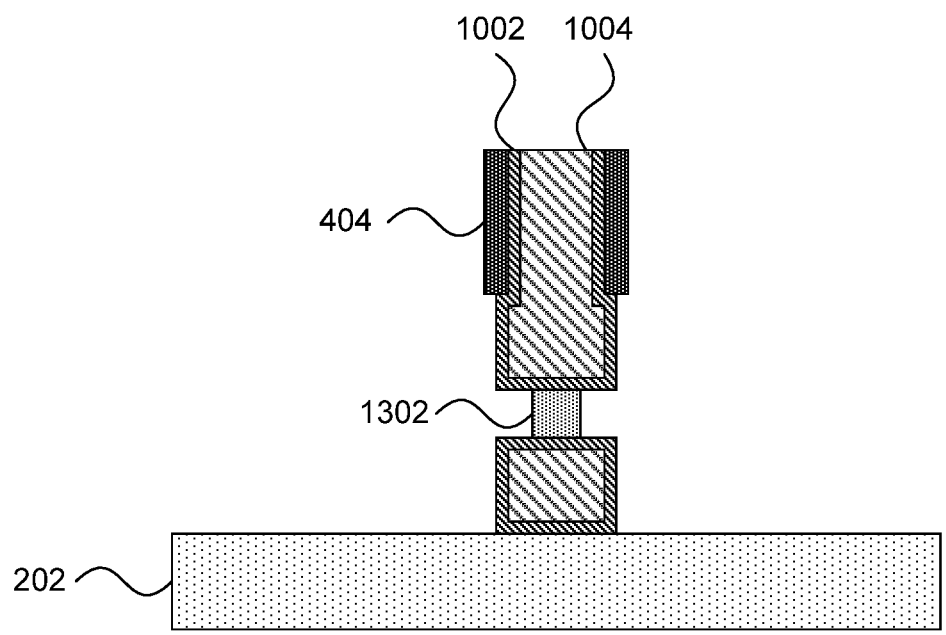
FIG. 13 is a cross-sectional diagram of a step in forming a single-electron transistor along the first cut in accordance with the present principles.

Referring now to FIG. 13, a cross-sectional view of a step in fabricating an SET is shown along cut A. A lateral wet etch is used to remove the remnant sacrificial layers 1202 and to further reduce the size of the trimmed active layer 1204, producing quantum dot 1302. It is specifically contemplated that the quantum dot 1302 may have an exemplary diameter of less than about 6 nm. The quantum dot 1302 is shown as being recessed from the surfaces of the gate dielectric 1002, but it should be understood that the quantum dot 1302 may have any relationship to the surface of the gate dielectric, including being flush therewith.

Figure 14:
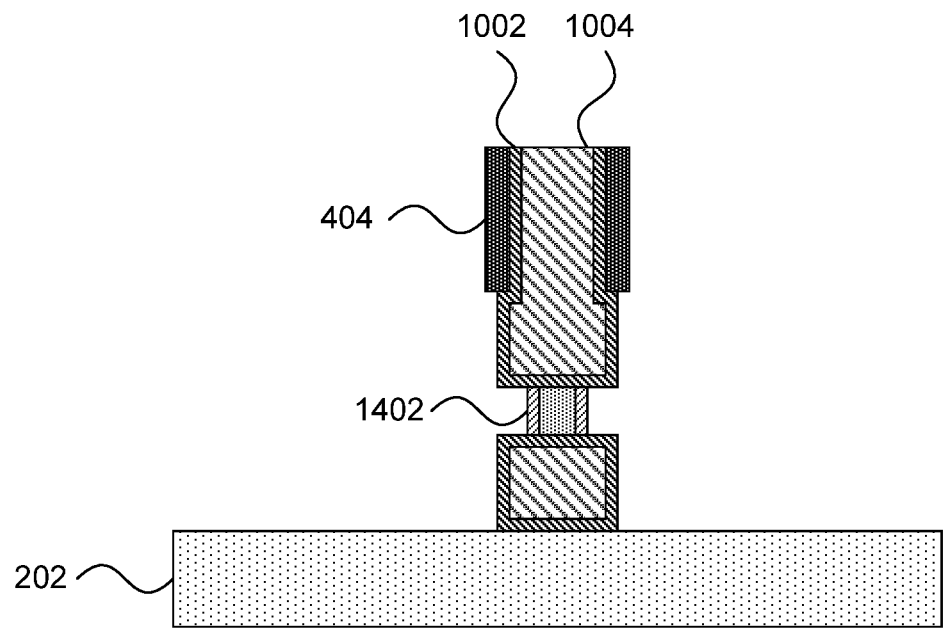
FIG. 14 is a cross-sectional diagram of a step in forming a single-electron transistor along the first cut in accordance with the present principles.

Referring now to FIG. 14, a cross-sectional view of a step in fabricating an SET is shown along cut A. Tunnel barriers 1402 is formed on the quantum dot 1302 by oxidizing the surface of the quantum dot 1302. It is specifically contemplated that this will form a silicon dioxide, although it should be understood that other forms of insulating barrier may be formed by other processes and in conjunction with other active layer materials.

Figure 15:
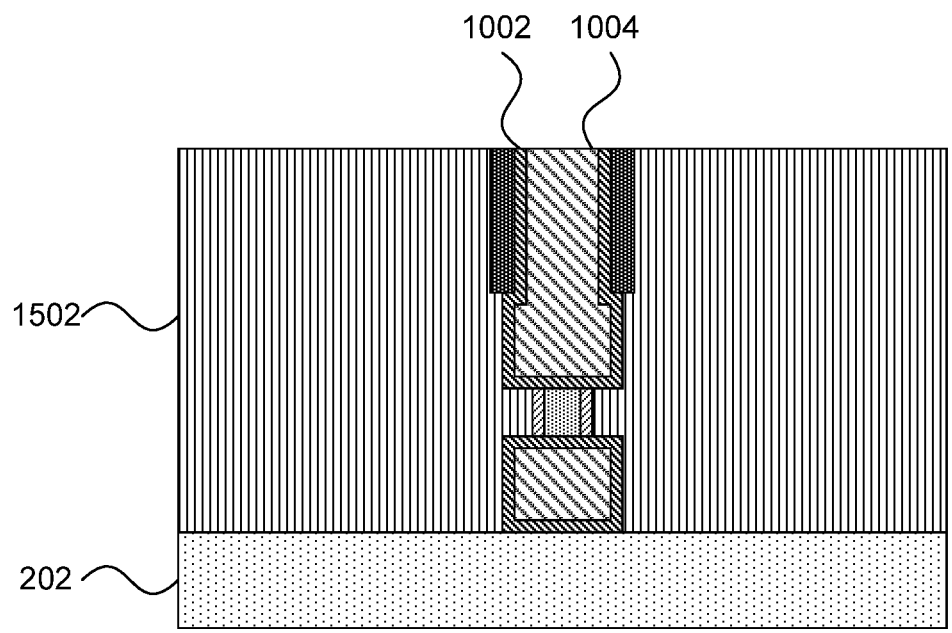
FIG. 15 is a cross-sectional diagram of a step in forming a single-electron transistor along the first cut in accordance with the present principles.

Referring now to FIG. 15, a cross-sectional view of a step in fabricating an SET is shown along cut A. Source and drain regions 1502 are formed on either side of the tunnel barriers 1402 and quantum dot 1302. The source and drain regions 1502 may be any appropriate conductive material and may be deposited using, e.g., CVD or epitaxial growth from the semiconductor substrate 202. Electrical contacts (not shown) may then be formed to the source/drain regions 1502 and the gate 1004 to provide connectivity to the SET.

If a semiconductor material is used for the source and drain regions 1502, such as silicon, it is specifically contemplated that the source and drain regions 1502 may be doped or silicided to provide increased conductivity. Doping for the source and drain regions 1502 may be provided in situ during deposition or growth or may, alternatively, be implanted. A silicide may be formed by depositing a refractory metal, such as nickel or titanium, onto the surface of a silicon-containing material. Following deposition, the structure is then subjected to an annealing step such as, but not limited to, rapid thermal annealing. During thermal annealing, the deposited metal reacts with the silicon forming a metal silicide.

It is to be understood that the present invention will be described in terms of a given illustrative architecture having a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 16:
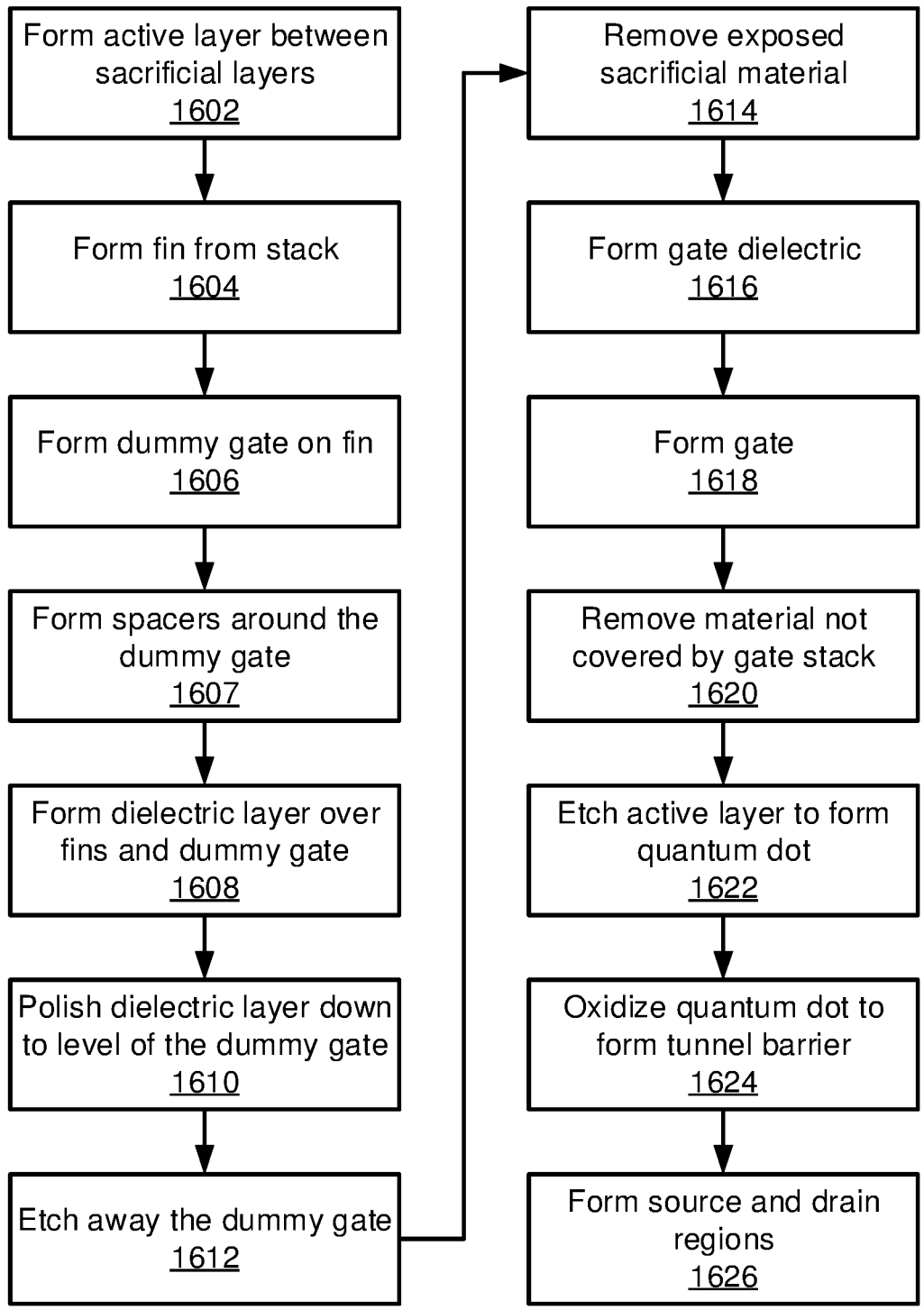
FIG. 16 is a block/flow diagram of a method of forming a single-electron transistor in accordance with the present principles.

Referring now to FIG. 16, a method of forming an SET is shown. Block 1602 forms active layer 206 between sacrificial layers 204 and 208. As stated above, it is specifically contemplated that active layer 206 may be formed from doped silicon, while sacrificial layers 204 and 208 may be formed from silicon germanium. Block 1604 forms a fin 302 in the stack of layers. It should be noted that, although only one fin 302 is described herein for the sake of simplicity, any number of fins can be formed in parallel or in other arrangements.

Block 1606 forms a dummy gate 406 over the fin 302. As stated above, it is specifically contemplated that the dummy gate may be formed from amorphous or polycrystalline silicon. Block 1607 then forms spacers 404 around the dummy gate using, e.g., silicon nitride or some other hardmask material. The spacer material may be formed conformally and then etched down using, e.g., a timed anisotropic etch to remove spacer material from the horizontal surfaces. Block 1608 forms a dielectric layer over and around the fins 302 and the dummy gate 406 and block 1610 polishes the dielectric layer down to the level of the dummy gate 406 using, e.g., CMP.

Block 1612 etches away the dummy gate 406 using, e.g., a dry or wet etch that selectively removes the dummy gate material, exposing the fin 302. Block 1614 removes exposed sacrificial material to expose the active layer 804, which is suspended from both ends in the gap 602. Block 1616 then forms a gate dielectric 1002 over all surfaces in the gap 602 and block 1618 forms gate 1004. It is specifically contemplated that the gate dielectric 1002 may be formed from a high-k dielectric material, while the gate 1004 may be formed from a conductive metal.

Block 1620 removes material not covered by the spacers 404, the gate dielectric 1002, and the gate 1004. This may be accomplished using an anisotropic etch such as RIE. Block 1622 uses a lateral etch such as, e.g., a wet chemical etch to remove material from the remaining active layer to form a quantum dot 1302. Block 1624 then oxidizes the quantum dot 1302 to form tunnel barriers 1402 on the exposed surfaces. Block 1626 deposits source and drain regions in contact with the tunnel barriers 1402 to complete the SET.

Having described preferred embodiments of single-electron transistor with wrap around-gate (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for forming a transistor, comprising:
   forming a fin comprising an active layer between two sacrificial layers;
   etching away material from the two sacrificial layers in a region of the fin;
   forming a gate stack around the active layer in the region; and
   etching the active layer after forming the gate stack to form a quantum dot.

2. The method of claim 1, further comprising oxidizing exposed surfaces of the quantum dot to form tunnel barriers, wherein the source and drain regions are in contact with the tunnel barriers.

3. The method of claim 1, further comprising etching away material from the fin that is not covered by the gate and spacers.

4. The method of claim 3, wherein etching the active layer further comprises etching away any remaining sacrificial material.

5. The method of claim 1, wherein forming the gate stack around the active layer comprises conformally forming a gate dielectric layer on surfaces in the region.

6. The method of claim 5, wherein forming the gate stack around the active layer comprises forming a full wrap-around gate around the active layer.

7. A method for forming a transistor, comprising:
   forming a fin comprising an active layer between two sacrificial layers;
   etching away material from the two sacrificial layers in a region of the fin;
   forming a gate stack around the active layer in the region;
   etching the active layer after forming the gate stack to form a quantum dot;
   forming a dielectric layer over and around the fin and the gate stack; and
   forming source and drain regions in contact with the active layer.

8. The method of claim 1, further comprising oxidizing exposed surfaces of the quantum dot to form tunnel barriers, wherein the source and drain regions are in contact with the tunnel barriers.

9. The method of claim 1, further comprising etching away material from the fin that is not covered by the gate and spacers.

10. The method of claim 9, wherein etching the active layer further comprises etching away any remaining sacrificial material.

11. The method of claim 7, further comprising polishing the dielectric layer down to a top level of the gate stack.

12. A method for forming a transistor, comprising:
   forming a fin comprising an active layer between two sacrificial layers;
   etching away material from the two sacrificial layers in a region of the fin;
   forming a gate stack around the active layer in the region, including forming a gate dielectric layer on surfaces in the region;
   etching the active layer after forming the gate stack to form a quantum dot; and
   forming source and drain regions in contact with the active layer.

13. The method of claim 12, further comprising oxidizing exposed surfaces of the quantum dot to form tunnel barriers, wherein the source and drain regions are in contact with the tunnel barriers.

14. The method of claim 12, further comprising etching away material from the fin that is not covered by the gate and spacers.

15. The method of claim 14, wherein etching the active layer further comprises etching away any remaining sacrificial material.

16. The method of claim 12, wherein forming the gate stack around the active layer comprises forming a full wrap-around gate around the active layer.

\* \* \* \* \*